(12) United States Patent
Allpress et al.

(10) Patent No.: US 7,796,700 B2
(45) Date of Patent: Sep. 14, 2010

(54) METHOD AND SYSTEM FOR COMPUTING LOG-LIKELIHOOD RATIOS FOR CODED QUADRATURE AMPLITUDE MODULATED SIGNALS

(75) Inventors: Steve Allpress, Bristol (GB); Steve Felix, Bristol (GB); Carlo Luschi, Bristol (GB)

(73) Assignee: Icera Inc. (GB)

( * ) Notice: Subject to any disclaimer, the term of this patent is extended or adjusted under 35 U.S.C. 154(b) by 1002 days.

(21) Appl. No.: 11/258,385

(22) Filed: Oct. 26, 2005

(65) Prior Publication Data

US 2006/0104378 A1 May 18, 2006

Related U.S. Application Data

(60) Provisional application No. 60/625,126, filed on Nov. 5, 2004.

(51) Int. Cl.
*H04L 23/02* (2006.01)
(52) U.S. Cl. ............ 375/261; 375/324; 375/241; 375/144; 375/262; 375/280; 714/702; 714/755; 714/780; 714/792
(58) Field of Classification Search .......... 375/261, 375/324, 144, 241, 280, 332; 714/702, 755, 714/780, 792
See application file for complete search history.

(56) References Cited

U.S. PATENT DOCUMENTS

| 4,773,038 | A | 9/1988 | Hillis et al. | |
|---|---|---|---|---|
| 6,594,318 | B1 * | 7/2003 | Sindhushayana | 375/262 |
| 6,661,832 | B1 * | 12/2003 | Sindhushayana et al. | 375/144 |
| 6,834,088 | B2 * | 12/2004 | Agami et al. | 375/324 |
| 7,185,260 | B2 * | 2/2007 | Coombs et al. | 714/755 |
| 7,343,530 | B2 * | 3/2008 | Shin | 714/702 |
| 2002/0051501 | A1 | 5/2002 | Demjanenko et al. | |
| 2005/0045896 | A1 | 3/2005 | Goh et al. | |
| 2007/0286292 | A1 * | 12/2007 | Moelker et al. | 375/241 |

FOREIGN PATENT DOCUMENTS

| CN | 87100892 A1 | 11/1988 |
|---|---|---|
| CN | 1429427 A1 | 7/2003 |
| WO | 0167617 A2 | 9/2001 |

OTHER PUBLICATIONS

Le Goff et al., "Turbo-Codes and High Spectral Efficiency Modulation", Proceedings of ICC '94, New Orleans, Lousiana, p. 645-649, May 1994.
Zesong et al., "Improved Binary Turbo Coded Modulation with 16QAM in HSDPA", Wireless Communications and Networking 2003, vol. 1, Mar. 16-20, 2003, pp. 322-325.

* cited by examiner

*Primary Examiner*—Eva Y Puente (57) ABSTRACT

According to an embodiment of the invention, a method and system is disclosed for determining log-likelihood ratios for a coded set of individual bits (40) of a quadrature amplitude modulation (QAM) codeword. In the method at most two constant values (33,35) may be determined to perform a set of predetermined functions, the output of each of function is based on the constant values and at least one received component corresponding to the codeword, to determine log-likelihood ratios (37) for each individual bit of the set of individual bits of the codeword. The QAM codeword may correspond to at least a portion of a signal of a wireless device, such as a mobile third-generation device operating according to a Wideband Code-Division Multiple Access (WCDMA) standard.

34 Claims, 12 Drawing Sheets

METHOD AND SYSTEM FOR COMPUTING LOG-LIKELIHOOD RATIOS FOR CODED QUADRATURE AMPLITUDE MODULATED SIGNALS

RELATED APPLICATIONS

This application is claims priority of U.S. Provisional Application 60/625,126 filed Nov. 5, 2004, the contents of which are hereby incorporated by reference.

FIELD OF THE INVENTION

This invention relates to the demodulation of quadrature amplitude modulation (QAM) signals in redundantly coded systems, and specifically to determining log-likelihood ratios for coded QAM signals.

BACKGROUND

In the transmission of streams of information bits in communication systems error correction codes and modulation schemes are required. One modulation scheme that is typically implemented is QAM. Error correction codes that often complement QAM are turbo codes, concatenated codes, convolutional codes, low density parity check (LDPC) codes or the like.

To decode a turbo coded QAM signal, a turbo decoder comprising of two maximum a posteriori (MAP) decoders, requires knowledge of the log-likelihood ratio of the received turbo coded bits. An approach to determine log-likelihood ratios for 16-QAM signals is disclosed in Goff et al., "Turbo-codes and High Spectral Efficiency Modulation", Proceedings of ICC, p. 645-649, May 1994.

In conventional systems, the computational complexity to calculate exact log-likelihood ratios is high, and approximations lead to degradation in receiver sensitivity.

Currently there is no known technology that provides a system or method for computing exact log-likelihood ratios for coded QAM signals without introducing a significant amount of computational complexity.

SUMMARY OF THE INVENTION

An aspect of the invention provides a method for determining log-likelihood ratios for quadrature amplitude modulation (QAM) signals of a set of bits of a QAM codeword, the method comprising determining log-likelihood ratios using a set of functions, the output of which is based on signal energy and noise power spectral density characteristics of the received signal corresponding to the codeword, to determine a log-likelihood ratio for each bit of the set of bits of the codeword.

In accordance with an embodiment the codeword is a turbo coded codeword. The signal being demodulated may be for a wireless system. The wireless system may be a mobile third-generation cellular system. The wireless system may operate according to a Code-Division Multiple Access (CDMA) standard. The wireless system may operate according to a High-Speed Downlink Packet Access (HSDPA) portion of the Wireless Code-Division Multiple Access (WCDMA) standard.

In other embodiments the codeword is a 16-QAM codeword. The set of individual bits of the codeword comprise four information bits mapped to the 16-QAM codeword. Two constant values may be determined that comprise an offset constant and a pre-scale constant. The first constant given by $8a^2 E_S/N_0$, and a second constant given by $4a\sqrt{E_S}/N_0$, where a is a normalization constant may also be determined.

In other embodiments a log-likelihood ratio $\Lambda$ for an individual bit $i_1$, given that the at least one received component is $r_I$, and a scaled received component $r'_I$ is defined as $r_I$ multiplied by a pre-scale constant k, and for an offset constant $\Delta$, in accordance with the function:

$$\Lambda_{i_1}(r'_I) = r'_I + \max^*(r'_I, \Delta) - \max^*(-r'_I, \Delta)$$

where the function max* is defined as $\max^*(x, y) = \max(x, y) + \ln(1 + \exp[-|x-y|])$ A log-likelihood ratio ($\Lambda$) may be determined for an individual bit $i_2$, given that the at least one received component is $r_I$, and a scaled received component $r'_I$ is defined as $r_I$ multiplied by a pre-scale constant k, and for an offset constant $\Delta$, in accordance with the function:

$$\Lambda_{i_2}(r'_I) = -\max^\$(-r'_I - \Delta, r'_Q - \Delta)$$

where the function max$^\$$ is defined by:

$$\max^\$(x, y) = \max(x, y) + \ln\left[1 + \exp[-|x-y|] - \exp\left[-\left|\frac{x-y}{2}\right|\right]\right].$$

A log-likelihood ratio ($\Lambda$) may be determined for an individual bit $q_1$, given that the at least one received component is $r_Q$, and a scaled received component $r'_Q$ is defined as $r_Q$ multiplied by a pre-scale constant k, and for an offset constant $\Delta$, in accordance with the function:

$$\Lambda_{q_1}(r'_Q) = r'_Q + \max^*(r'_Q, \Delta) - \max^*(-r'_Q, \Delta)$$

where the function max* is defined as $\max^*(x, y) = \max(x, y) + \ln(1 + \exp[-|x-y|])$. A log-likelihood ratio ($\Lambda$) may be determined for an individual bit $q_2$, given that the at least one received component is $r_Q$, and a scaled received component $r'_Q$ is defined as $r_Q$ multiplied by a pre-scale constant k, and for an offset constant $\Delta$, in accordance with the function:

$$\Lambda_{q_2}(r'_Q) = -\max^\$(-r_Q - \Delta, r'_Q - \Delta)$$

where the function max$^\$$ is defined by:

$$\max^\$(x, y) = \max(x, y) + \ln\left[1 + \exp[-|x-y|] - \exp\left[-\left|\frac{x-y}{2}\right|\right]\right].$$

In other embodiments, a custom-coded instruction may be used to configure a reconfigurable execution unit to perform at least a portion of a determination of a log-likelihood ratio for at least one of the individual bits, the determination comprising using at least one of the at most two constant values. The value of an input of the reconfigurable execution unit may be set based on the at least one constant value used in the log-likelihood ratio determination. The reconfigurable execution unit may be used to complete a calculation of the log-likelihood ratio for the at least one individual bit in two cycles. The reconfigurable execution unit may be used to complete a calculation of the log-likelihood ratio for the at least one individual bit in one cycle. The reconfigurable execution unit may comprise a single instruction multiple data lane of a computer system. The computer system may comprise a separate control execution path and a separate data execution path. The reconfigurable execution unit may form a portion of the separate data execution path.

An aspect of the invention provides a computer system, the system comprising a dedicated control execution path comprising a branch unit and a control execution unit; and a dedicated data execution path comprising a reconfigurable execution unit; wherein the reconfigurable execution unit comprises a single instruction multiple data (SIMD) lane of the computer system, and wherein the reconfigurable execution unit is capable of being configured by a custom-coded instruction to perform at least a portion of a determination of a log-likelihood ratio for an individual bit of a quadrature amplitude modulation (QAM) codeword.

In embodiments the determination of the log-likelihood ratio is made using a function, the output of which is based on received signal characteristics corresponding to the codeword, to determine a log-likelihood ratio for each bit of the set of bits of the codeword. The received signal characteristics corresponding to the codeword may comprise signal energy and noise power spectral density. The determination of the log-likelihood ratio may further comprise determining two constant values that comprise an offset constant and a pre-scale constant. A first constant given by $8a^2 E_s/N_0$, and a second constant given by $4a\sqrt{E_s}/N_0$, where a is a normalization constant may be determined. An input value of the reconfigurable execution unit may be determined based on at least one constant value used in the log-likelihood ratio determination. The reconfigurable execution unit may be capable of calculating the log-likelihood ratio for the at least one individual bit in two cycles. The reconfigurable execution unit may be capable of calculating the log-likelihood ratio for the at least one individual bit in one cycle.

BRIEF DESCRIPTION OF THE DRAWINGS

A system and method for incorporating the present invention will now be described, by way of an example only, with reference to the accompanying drawings, in which.

DETAILED DESCRIPTION

In embodiments according to the invention, a method and system is disclosed for determining log-likelihood ratios of individual bits of information symbols of a QAM signal for a turbo decoder.

The embodiments of the invention described herein are provided for illustrative purposes and are particularly suitable for deriving log-likelihood ratios in 16-QAM/turbo coded systems operating in additive white Gaussian noise channels (AWGN). Such a system is supported in the 3rd Generation Partnership Project (3GPP) high speed downlink shared channel (HS-DSCH) of wide band code division multiple access (WCDMA) standards, technical specification Release 5 [3G TS 25.213] (WCDMA Release 5).

However, it is to be noted that embodiments of the invention may be applied to other QAM/coded systems, for example 32, 64, 256, etc. QAM systems, and other applications for example modem, communicating high definition television signals, or the like. Additionally, other error correction codes, other than turbo coding, may be implemented. Such error correction codes include concatenated codes, low density parity check (LDPC) codes, convolutional codes and the like. The scope of the invention is not to be limited to the specific turbo coded 16-QAM level of modulation embodiments.

Figure 1:
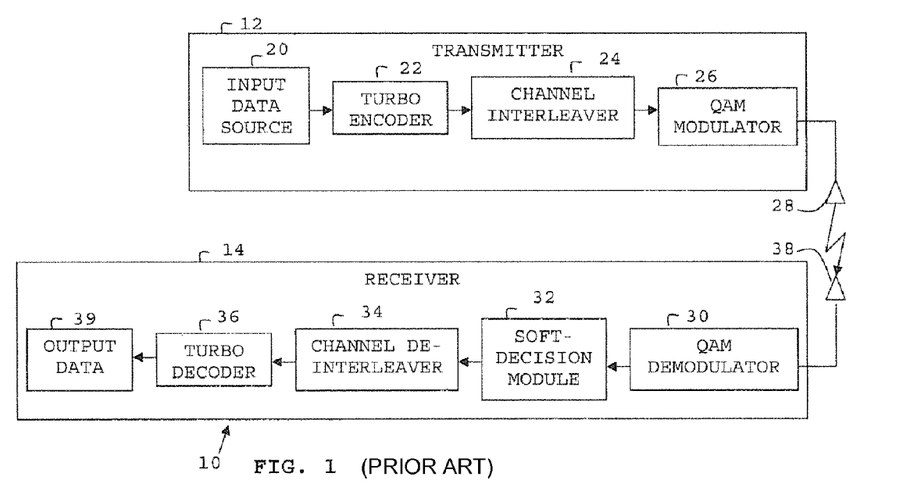
FIG. 1 shows a block diagram of a communication system having turbo coded QAM signals in accordance with the prior art.

FIG. 1 shows a block diagram of a conventional communication system 10 having a transmitter 12 and a receiver 14. The transmitter is provided with input data bits/frame from a source 20 to turbo encoder 22. Turbo encoder encodes the input data providing systematic and parity bits to a channel interleaver 24 prior to QAM modulator 26. The modulated signal is transmitted by transmission means 28 to receiving means 38 of receiver. Upon the demodulation of the turbo coded QAM signals received at a QAM demodulator 30, channel state information and soft-decisions for each incoming information symbol bit associated with the turbo coded QAM signals are performed at module 32 for a turbo decoder 36 to decode the signal via channel deinterleaver 34 to provide output data 39.

Figure 2:
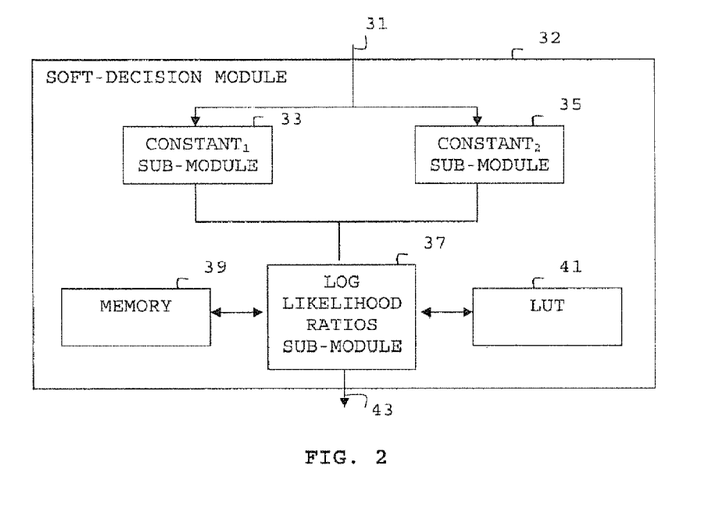
FIG. 2 shows a block diagram of a soft-decision module in accordance with an embodiment of the invention.

The soft-decisions calculated in the module 32 are log-likelihood ratios. FIG. 2 shows a block diagram of soft-decision module 32 in accordance with an embodiment of the invention. The demodulated QAM signal 31 is received at module 32 and constant sub-modules 33,35 process the constants to calculate in log-likelihood ratio sub-module 37 the functions stored in look up table (LUT) 41. The log-likelihood ratios 43 may be stored in memory 39 and sent to the turbo decoder. Implementations of the module 32 in accordance with an embodiment of the invention are discussed in more detail with respect to FIG. 11-13.

Figure 3A:
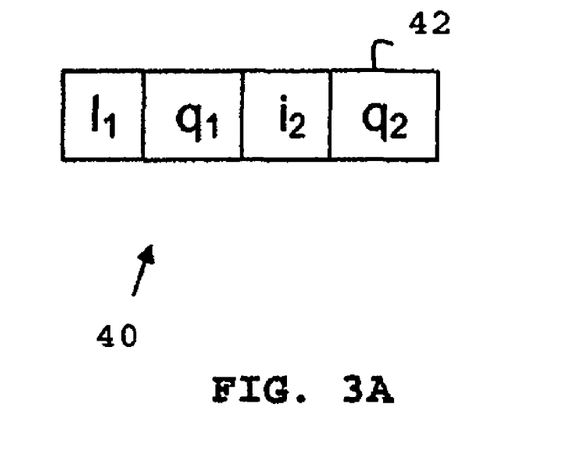
FIG. 3A-B show a bit-to-codeword mapping for 16-QAM modulation mode, and a bit-to-symbol mapping to the modulated constellation symbols for 16-QAM modulation, respectively.
Figure 3B:
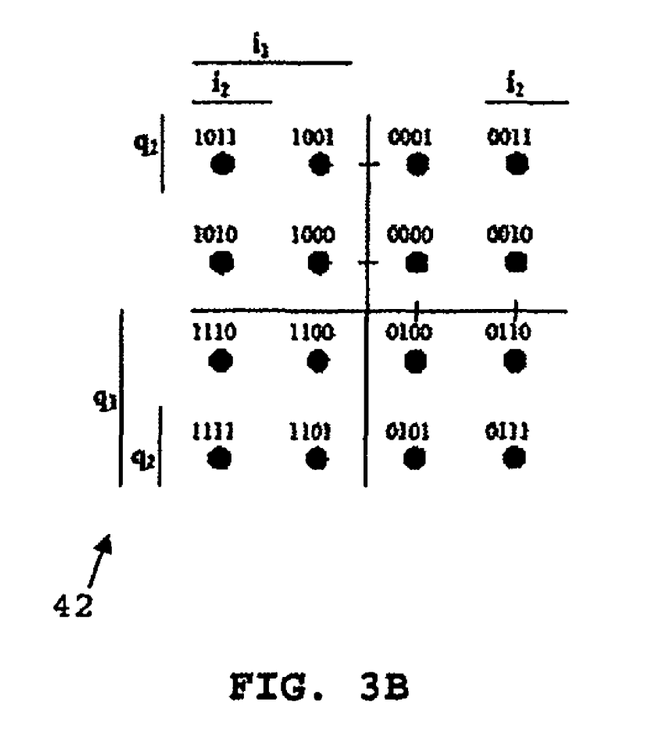

A log-likelihood ratio in accordance with an embodiment of the invention may be derived for each of the individual bits $i_1$, $q_1$, $i_2$, and $q_2$ of the bit-to-codeword mapping 40 as a function of the received signal from QAM demodulator as shown in FIG. 3A. The resulting four information bits 40 are mapped to the constellation symbols as shown in the 16 QAM constellation 42 of FIG. 3B to define which 16-QAM symbol to transmit. The received signal from the demodulator is represented by the complex number $r=r_I+jr_Q$, where the variances of $r_I$ and $r_Q$ are equal to $N_0/2$ and each have independent means of:

$$\{-3a\sqrt{E_S},-a\sqrt{E_S},+a\sqrt{E_S},+3a\sqrt{E_S}\}$$

depending on the transmitted signal, where $E_S$ is the coded symbol energy and $N_0$ is the single sided noise power spectral density. Here, a is a constant used to normalize the average symbol energy of the entire constellation, and may be set to equal $1/\sqrt{10}$. It should be noted that other values may be used. For example in the WCDMA Release 5, a is set to equal $1/\sqrt{5}$.

Figure 4:
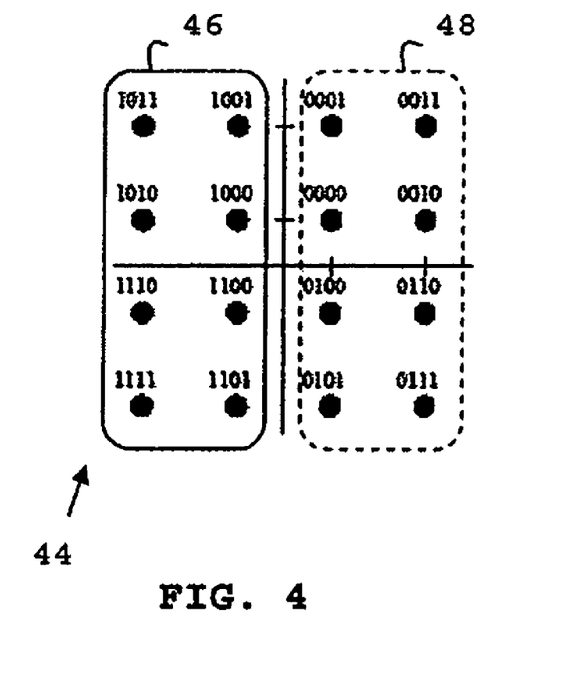
FIG. 4 shows a partitioning of the bit-to-symbol mapping of FIG. 3A, for bit $i_1$, in accordance with an embodiment of the invention.

As evident from the bit-to-symbol mapping of FIG. 3A-B, detection of $i_1$ and $i_2$ depends only on $r_I$, and detection of $q_1$ and $q_2$ depends only on $r_Q$. To detect bit $i_1$ in accordance with an embodiment of the invention, the set of 16-QAM symbols of FIG. 3B is split into two halves, as shown in FIG. 4. The constellation cluster comprised of the two left columns 46 correspond to 16-QAM symbols with $i_1=1$, and the constellation cluster comprised of right two columns 48 correspond to 16-QAM symbols with $i_1=0$. In order to determine the log-likelihood ratio for $i_1$, it is necessary to compute the posterior probabilities, defined as $$P(i_1=0|r'_I) \text{ and}$$

$$P(i_1=1|r'_I)$$

The ratio of these probabilities, or the logarithm of the ratio, is passed to the turbo-decoder.

In order to compute the log-likelihood ratio for $i_1$. Bayes' theorem is used to relate the conditional probabilities:

$$P(i_1=0|r_I)= \qquad \text{(EQUATION 1)}$$
$$\frac{p(r_I|i_1=0)P(i_1=0)}{p(r_I|i_1=0)P(i_1=0)+p(r_I|i_1=1)P(i_1=1)}$$

$$P(i_1=1|r_I)= \qquad \text{(EQUATION 2)}$$
$$\frac{p(r_I|i_1=1)P(i_1=1)}{p(r_I|i_1=0)P(i_1=0)+p(r_I|i_1=1)P(i_1=1)}$$

An assumption may be made that the symbols are equiprobable, i.e. $P(i_1=0)=P(i_1=1)=\frac{1}{2}$, such that:

$$\frac{P(i_1=0|r_I)}{P(i_1=1|r_I)}=\frac{p(r_I|i_1=0)}{p(r_I|i_1=1)} \qquad \text{(EQUATION 3)}$$

Accordingly, the two required conditional probabilities may be written as:

$$p(r_I|i_1=0)=\frac{1}{2\sqrt{N_0\pi}}\exp\left[-\frac{(r_I-a\sqrt{E_S})^2}{N_0}\right]+ \qquad \text{(EQUATION 4)}$$
$$\frac{1}{2\sqrt{N_0\pi}}\exp\left[-\frac{(r_I-3a\sqrt{E_S})^2}{N_0}\right]$$

$$p(r_I|i_1=1)=\frac{1}{2\sqrt{N_0\pi}}\exp\left[-\frac{(r_I+a\sqrt{E_S})^2}{N_0}\right]+$$
$$\frac{1}{2\sqrt{N_0\pi}}\exp\left[-\frac{(r_I+3a\sqrt{E_S})^2}{N_0}\right]$$

Manipulating EQUATION 4, the log-likelihood ratio of $i_2$ may be represented as:

$$\Lambda_{i_1}(r_I)=\ln\left(\frac{\exp[2ar_I\sqrt{E_S}/N_0]+\exp[-8a^2E_S/N_0+6ar_I\sqrt{E_S}/N_0]}{\exp[-2ar_I\sqrt{E_S}/N_0]+\exp[-8a^2E_S/N_0-6ar_I\sqrt{E_S}/N_0]}\right)$$

or, equivalently, $$\Lambda_{i_1}(r_I)=\frac{4ar_I\sqrt{E_S}}{N_0}+\max^*\left(\frac{4ar_I\sqrt{E_S}}{N_0},\frac{8a^2E_S}{N_0}\right)- \qquad \text{(EQUATION 5)}$$
$$\max^*\left(\frac{-4ar_I\sqrt{E_S}}{N_0},\frac{8a^2E_S}{N_0}\right)$$

where the function max* is defined as:

$$\max^*(x,y)=\max(x,y)+\ln(1+\exp[-|x-y|]).$$

Approximating max*(x, y)=max(x, y) breaks EQUATION 5 into three regions. Approximation may be conducted in this manner, however, approximating is not limited to this example, other approximating methods may be used. Approximating in this example provides:

$$\Lambda_{iI}(r_I)=\begin{cases} 8a^2E_S/N_0+8ar_I\sqrt{E_S}/N_0 & \text{for } r_I\leq-2a\sqrt{E_S} \\ 4ar_I\sqrt{E_S}/N_0 & \text{for } -2a\sqrt{E_S}\leq r_I\leq 2a\sqrt{E_S} \\ -8a^2E_S/N_0+8ar_I\sqrt{E_S}/N_0 & \text{for } r_I\geq 2a\sqrt{E_S} \end{cases} \qquad \text{(EQUATION 6)}$$

Substituting $r_I$ for $r_Q$, and following an identical approach, we may obtain the log-likelihood ratio for $q_1$, for which the analogous version of EQUATION 5 is as follows:

$$\Lambda_{q_1}(r_Q)=$$

-continued $$\frac{4ar_Q\sqrt{E_S}}{N_0} + \max^*\left(\frac{4ar_Q\sqrt{E_S}}{N_0}, \frac{8a^2E_S}{N_0}\right) - \max^*\left(\frac{-4ar_Q\sqrt{E_S}}{N_0}, \frac{8a^2E_S}{N_0}\right) \quad 5$$

Figure 5:
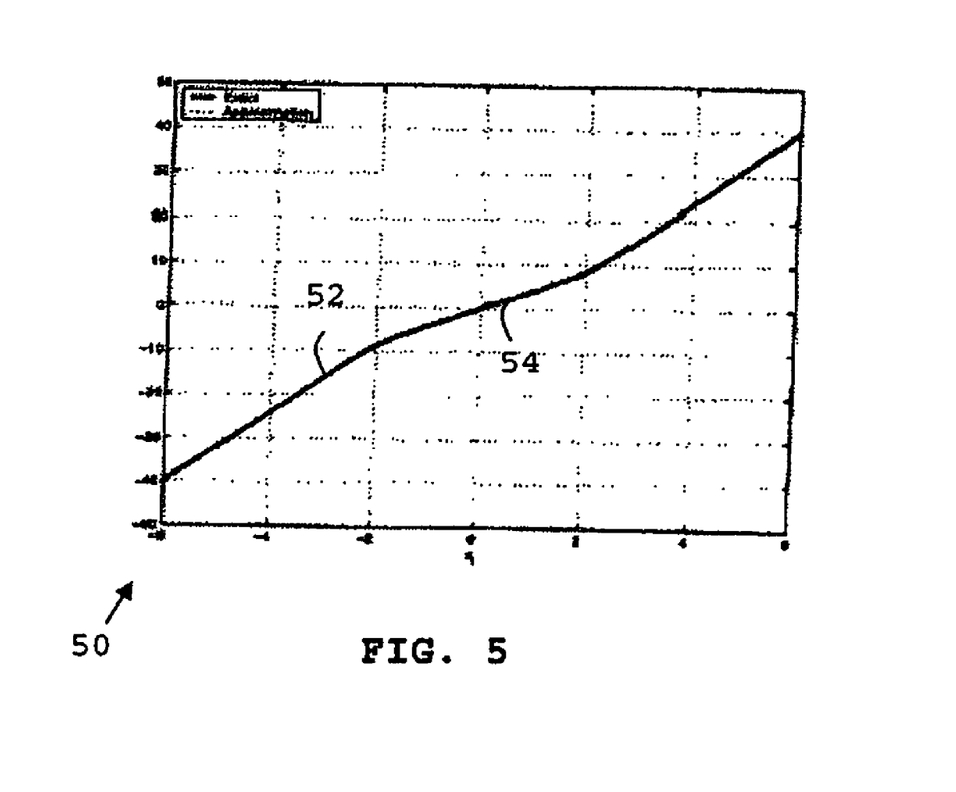
FIG. 5 shows a graph of the log-likelihood ratio for bit $i_1$ as a function of the received component $r_I$, determined in accordance with an embodiment of the invention.

Normalizing $N_0$ to unity in EQUATION 5 results in the graph 50 shown in FIG. 5 of the log-likelihood ratio for bit $i_1$ as a function of the received component $r_I$, for $E_S/N_0=10$ dB, determined in accordance with an embodiment of the invention. At this ratio of $E_S/N_0$ the difference between the approximation 52 and the exact 54 expression is quite small, and this difference reduces with increasing $E_S/N_0$. The similarity of EQUATION 5, for the log-likelihood ratio $\Lambda_{i1}$ of bit $i_1$, with the above equation for the log-likelihood ratio $\Lambda_{q1}$ of bit $q_1$, it is clear that a graph having a similar pattern to the function $\Lambda_{i1}$ shown in FIG. 5, may be made for the log-likelihood ratio $\Lambda_{q1}$ of bit $q_1$ as a function of the received component $r_Q$.

Figure 6:
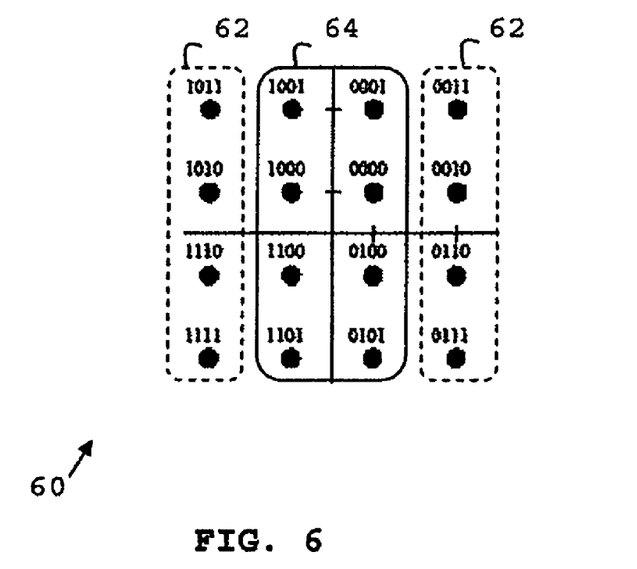
FIG. 6 shows a partitioning of the bit-to-symbol mapping of FIG. 3A, for bit $i_2$, in accordance with an embodiment of the invention.

Repeating the above approach, the log-likelihood ratio for bit $i_2$ may be obtained in accordance with an embodiment of the invention. FIG. 6 shows a partitioning of the 16-QAM constellation for the $i_2$ bit. The constellation cluster comprised of the left column 62 and right column 62 correspond to 16-QAM symbols with $i_2=1$, and the constellation cluster comprised of the middle two columns 64 correspond to 16-QAM symbols with $i_2=0$. The different partitioning of the 16-QAM constellation for bit $i_2$ yields a different set of probability density functions, and hence results in a different function. For $i_2$, the conditional probabilities are given by:

$$p(r_I|i_2=0) = \frac{1}{2\sqrt{N_0\pi}}\exp\left[-\frac{(r_I - a\sqrt{E_S})^2}{N_0}\right] + \frac{1}{2\sqrt{N_0\pi}}\exp\left[-\frac{(r_I + a\sqrt{E_S})^2}{N_0}\right] \quad \text{(EQUATION 7)}$$

$$p(r_I|i_2=1) = \frac{1}{2\sqrt{N_0\pi}}\exp\left[-\frac{(r_I - 3a\sqrt{E_S})^2}{N_0}\right] + \frac{1}{2\sqrt{N_0\pi}}\exp\left[-\frac{(r_I + 3a\sqrt{E_S})^2}{N_0}\right]$$

The distribution of $r_Q$ is independent of $i_2$, $$p(r_Q|i_2=0) = p(r_Q|i_2=1) \quad \text{(EQUATION 8)}$$

which reduces the log-likelihood ratio for $i_2$ to:

$$\Lambda_{i2}(r_I) = \ln\left(\frac{\exp[2ar_I\sqrt{E_S}/N_0] + \exp[-2ar_I\sqrt{E_S}/N_0]}{\exp[-6ar_I\sqrt{E_S}/N_0 - 8a^2E_S/N_0] + \exp[6ar_I\sqrt{E_S}/N_0 - 8a^2E_S/N_0]}\right)$$

$$= \frac{8a^2E_S}{N_0} - \max^*\left(\frac{6ar_I\sqrt{E_S}}{N_0}, \frac{-6ar_I\sqrt{E_S}}{N_0}\right) + \max^*\left(\frac{2ar_I\sqrt{E_S}}{N_0}, \frac{-2ar_I\sqrt{E_S}}{N_0}\right)$$

$$= -\max\left(\frac{4ar_I\sqrt{E_S}}{N_0} - \frac{8a^2E_S}{N_0}, \frac{-4ar_I\sqrt{E_S}}{N_0} - \frac{8a^2E_S}{N_0}\right) -$$

$$\ln\frac{\left[1 + \exp\left(-\left|\frac{12ar_I\sqrt{E_S}}{N_0}\right|\right)\right]}{\left[1 + \exp\left(-\left|\frac{4ar_I\sqrt{E_S}}{N_0}\right|\right)\right]}$$

re-written as:

$$\Lambda_{i2}(r_I) = \quad \text{(EQUATION 9)}$$

$$-\max^\$\left(\frac{4ar_I\sqrt{E_S}}{N_0} - \frac{8a^2E_S}{N_0}, \frac{-4ar_I\sqrt{E_S}}{N_0} - \frac{8a^2E_S}{N_0}\right)$$

by defining the function:

$$\max^\$(x, y) = \max(x, y) + \ln\left[1 + \exp[-|x-y|] - \exp\left[-\left|\frac{x-y}{2}\right|\right]\right]$$

EQUATION 9 may be split into two regions, positive and negative, by approximating $$\max^\$(x,y) \approx \max(x,y), \text{i.e.:}$$

$$\Lambda_{i2}(r_I) = \begin{cases} 4ar_I\sqrt{E_S}/N_0 + 8a^2E_S/N_0 & \text{for } r_I \leq 0 \\ -4ar_I\sqrt{E_S}/N_0 + 8a^2E_S/N_0 & \text{for } r_I \geq 0 \end{cases} \quad \text{(EQUATION 10)}$$

Figure 7:
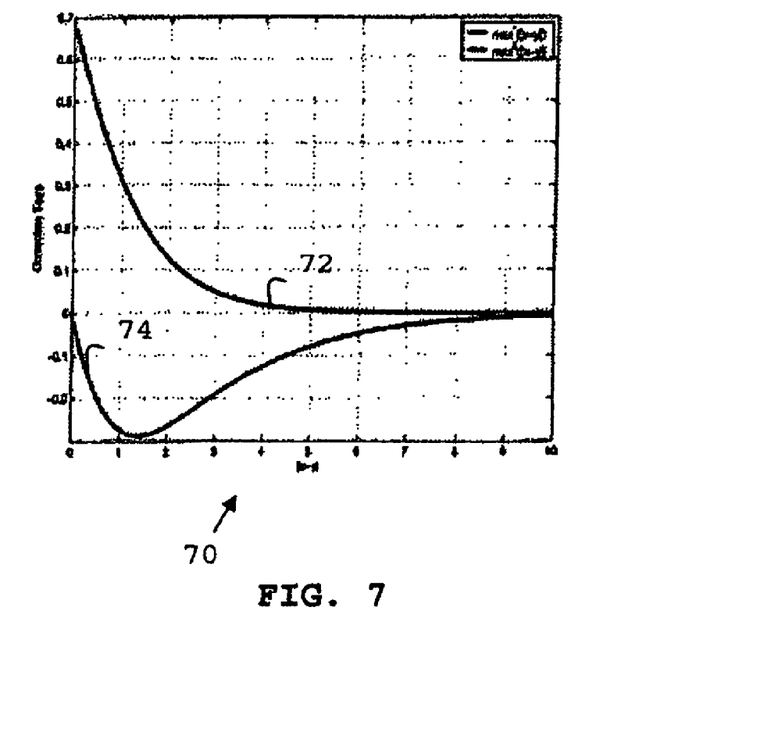
FIG. 7 shows the decreasing value of a correction term in accordance with an approximation used in an embodiment of the invention.

The approximation of EQUATION 10 holds true by ignoring the last term (the logarithm term) in the definition of the $\max^\$(x,y)$ function given above. The graph 70 of FIG. 7 shows the approximation is a good approximation as $|x-y|$ gets larger, for ignoring the last term in both the max* and max$^\$$ functions, the x-axis is $|x-y|$, while the top curve 72 is the last term for the max* function, and the bottom curve 74 is the last term for the max$^\$$ function. In FIG. 7, both correction terms approach zero as $|x-y|$ increases, and therefore the approximation made for EQUATION 10 holds true as $|x-y|$ increases.

Substituting $r_Q$ for $r_I$, and following an identical approach, we may obtain the log-likelihood ratio for $q_2$, for which the analogous version of EQUATION 9 is as follows:

$$\Lambda_{q2}(r_Q) = -\max^\$\left(\frac{4ar_Q\sqrt{E_S}}{N_0} - \frac{8a^2E_S}{N_0}, \frac{-4ar_Q\sqrt{E_S}}{N_0} - \frac{8a^2E_S}{N_0}\right)$$

Figure 8:
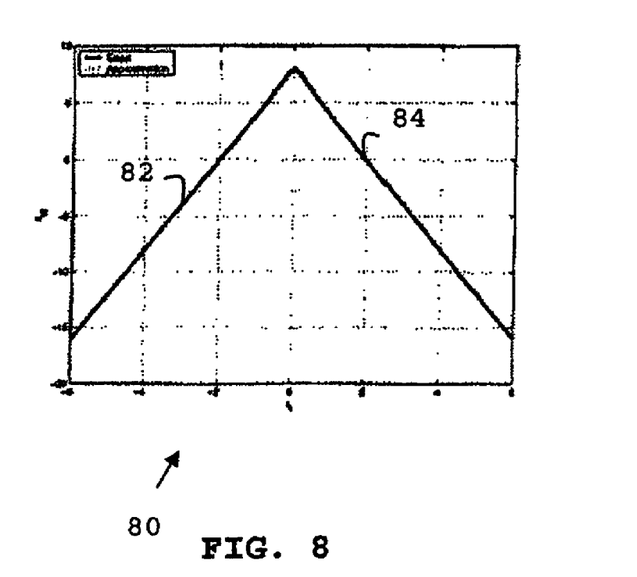
FIG. 8 shows a graph of the log-likelihood ratio for bit $i_2$ as a function of the received component $r_I$, determined in accordance with an embodiment of the invention.

Using EQUATION 9, FIG. 8 shows a graph 80 of the log-likelihood ratio for bit $i_2$ as a function of the received component $r_I$, determined in accordance with an embodiment of the invention. Because of the similarity of EQUATION 9, for the log-likelihood ratio $\Lambda_{i2}$ of bit $i_2$, with the equation above for the log-likelihood ratio $\Lambda_{q2}$ of bit $q_2$, it is clear that a graph having a similar pattern to the function $\Lambda_{i2}$ shown in FIG. 8, may be made for the log-likelihood ratio $\Lambda_{q2}$ of bit $q_2$ as a function of the received component $r_Q$.

Based on EQUATION 5 and 9 and their analogues for $q_1$ and $q_2$, the log-likelihood ratio calculations for each bit may be summarized as follows in TABLE 1, in accordance with an embodiment of the invention. In TABLE 1, an offset constant Δ, and a pre-scale constant k, are defined for constants that appear in EQUATION 5 and 9. Using these constant definitions, and letting $r'_I=kr_I$, and $r'_Q=kr_Q$, the resulting log-likelihood ratio calculations for each bit may be as follows:

TABLE 1

| Bit | Log-likelihood Ratio |
|---|---|
| $I_1$ | $\Lambda_{i1}(r'_I) = r'_I + \max^*(r'_I, \Delta) - \max^*(-r'_I, \Delta)$ |
| $I_2$ | $\Lambda_{i2}(r'_I) = -\max^\$(-r'_I - \Delta, r'_I - \Delta)$ |
| $Q_1$ | $\Lambda_{q1}(r'_Q) = r'_Q + \max^*(r'_Q, \Delta) - \max^*(-r'_Q, \Delta)$ |
| $Q_2$ | $\Lambda_{q2}(r'_Q) = -\max^\$(-r'_Q - \Delta, r'_Q - \Delta)$ |

In accordance with an embodiment of the invention, the log-likelihood ratio calculations of TABLE 1 and the above derivation may be implemented using a reconfigurable deep execution processor, discussed in more detail with reference to FIG. 11-15. As may be seen from TABLE 1 and the associated definitions, only two constants, i.e. the offset constant Δ and the pre-scale constant k used to define $r'_I$ and $r'_Q$, need to be computed, at a very low frequency, in order to determine all four log-likelihood ratios. These may be computed for a block of data, and the pre-scaling applied as part of the Maximal Ratio Combining (MRC) process.

Figure 9:
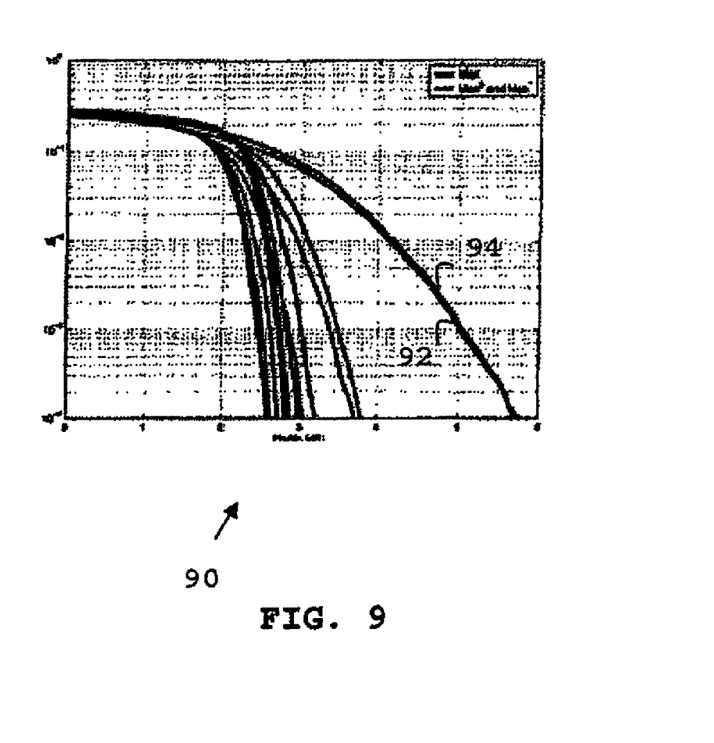
FIG. 9 shows the performance gain, for full turbo decoder iterations 1 through 6 in accordance with an embodiment of the invention.

FIG. 9 shows a graph 90 of the performance gain (BER and $E_b/N_0$), for full turbo decoder iterations 1 through 6, that may be achieved with an embodiment of the invention 92, compared with the conventional approach 94 taken by Goff et al. Thus, as may be seen from FIG. 9, an embodiment according to the invention may be used to either improve the sensitivity of the receiver by approximately 0.25 dB.

Figure 10:
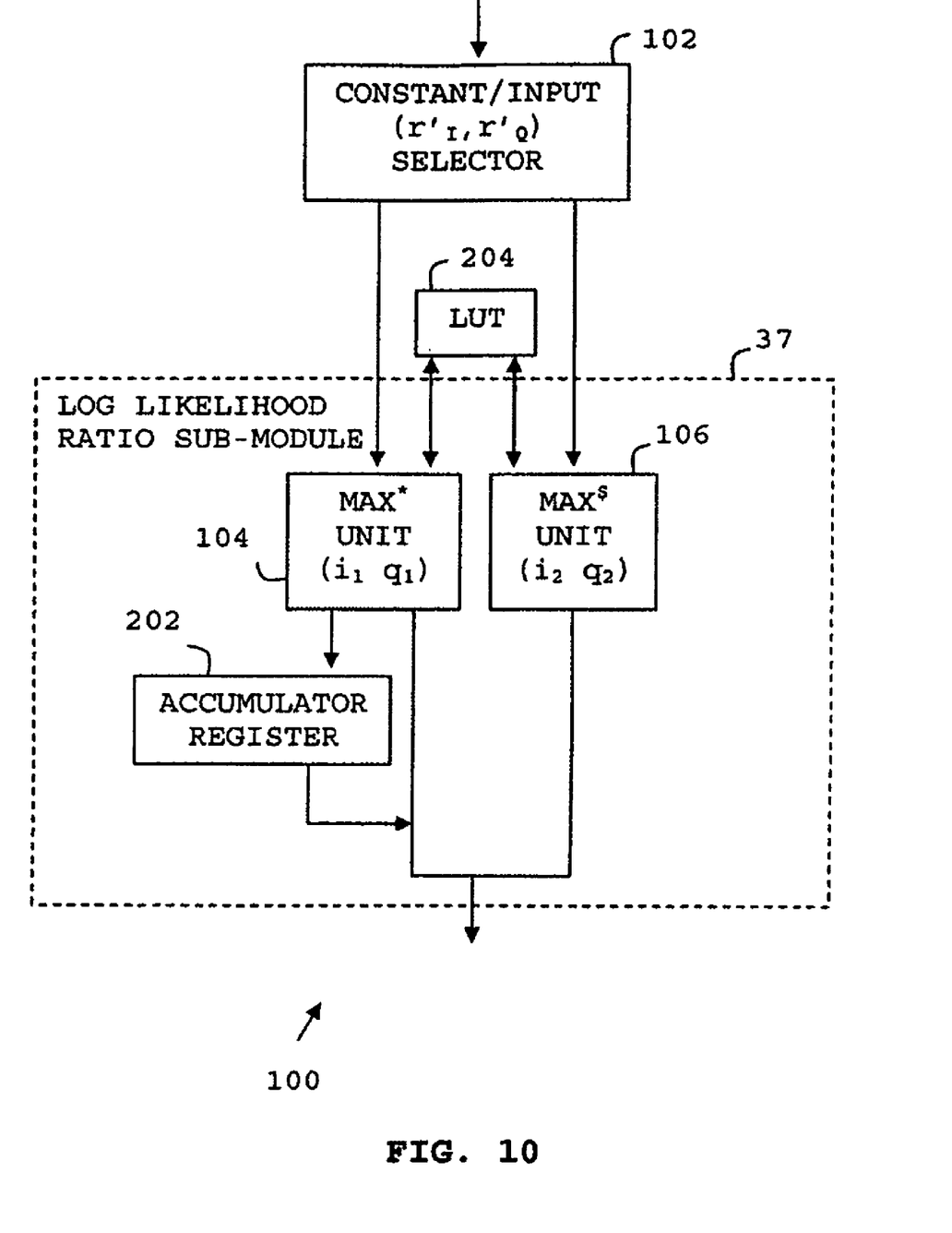
FIG. 10 shows a block diagram of a computer system in which log-likelihood ratios may be determined in accordance with an embodiment of the invention.
Figure 11:
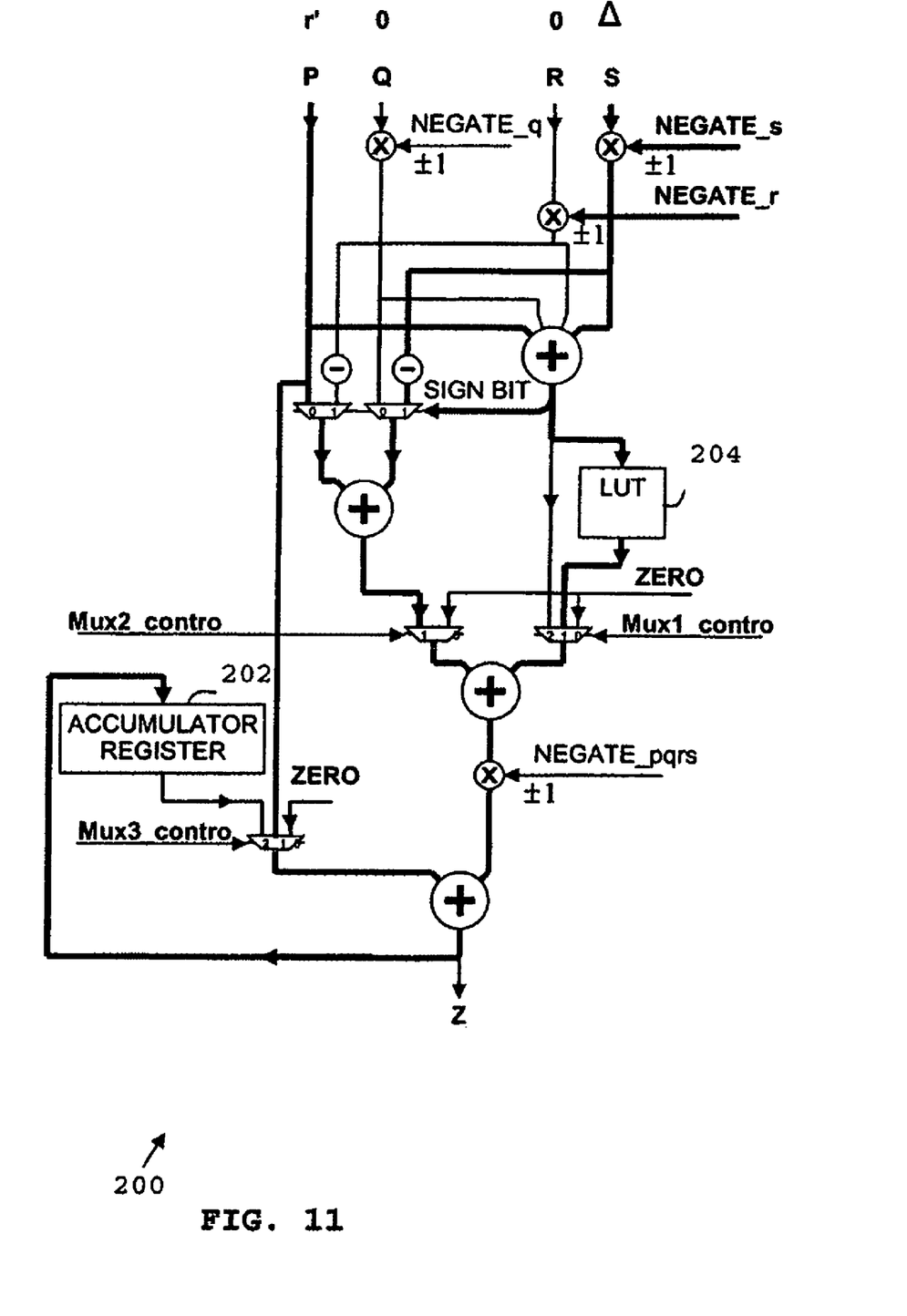
FIG. 11 shows a schematic of a reconfigurable execution unit, configured for performing a first step of a calculation of the log-likelihood ratios for $i_1$ and $q_1$, in accordance with an embodiment of the invention.
Figure 12:
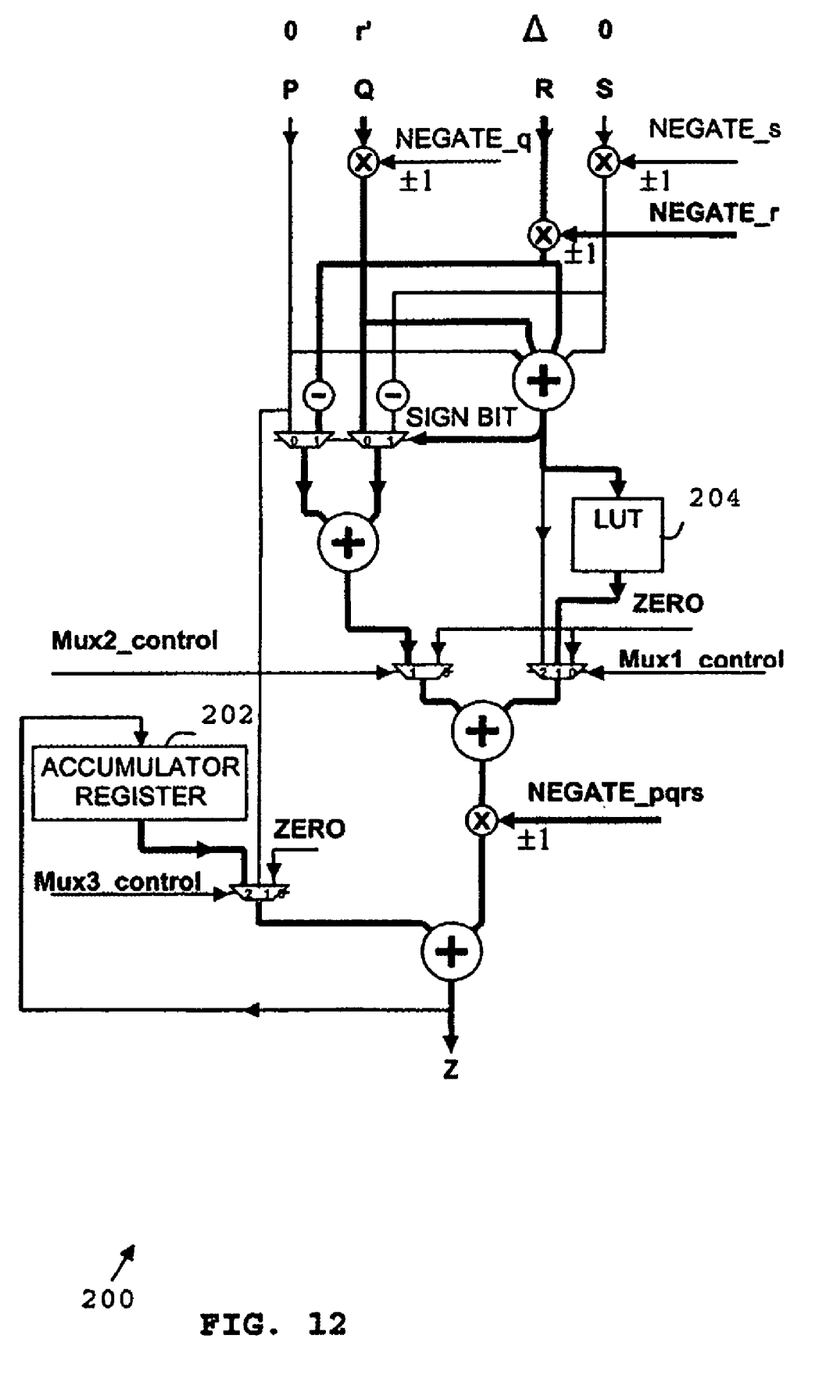
FIG. 12 shows a schematic of a reconfigurable execution unit, configured for performing a second step of a calculation of the log-likelihood ratios for $i_1$ and $q_1$, in accordance with an embodiment of the invention.
Figure 13:
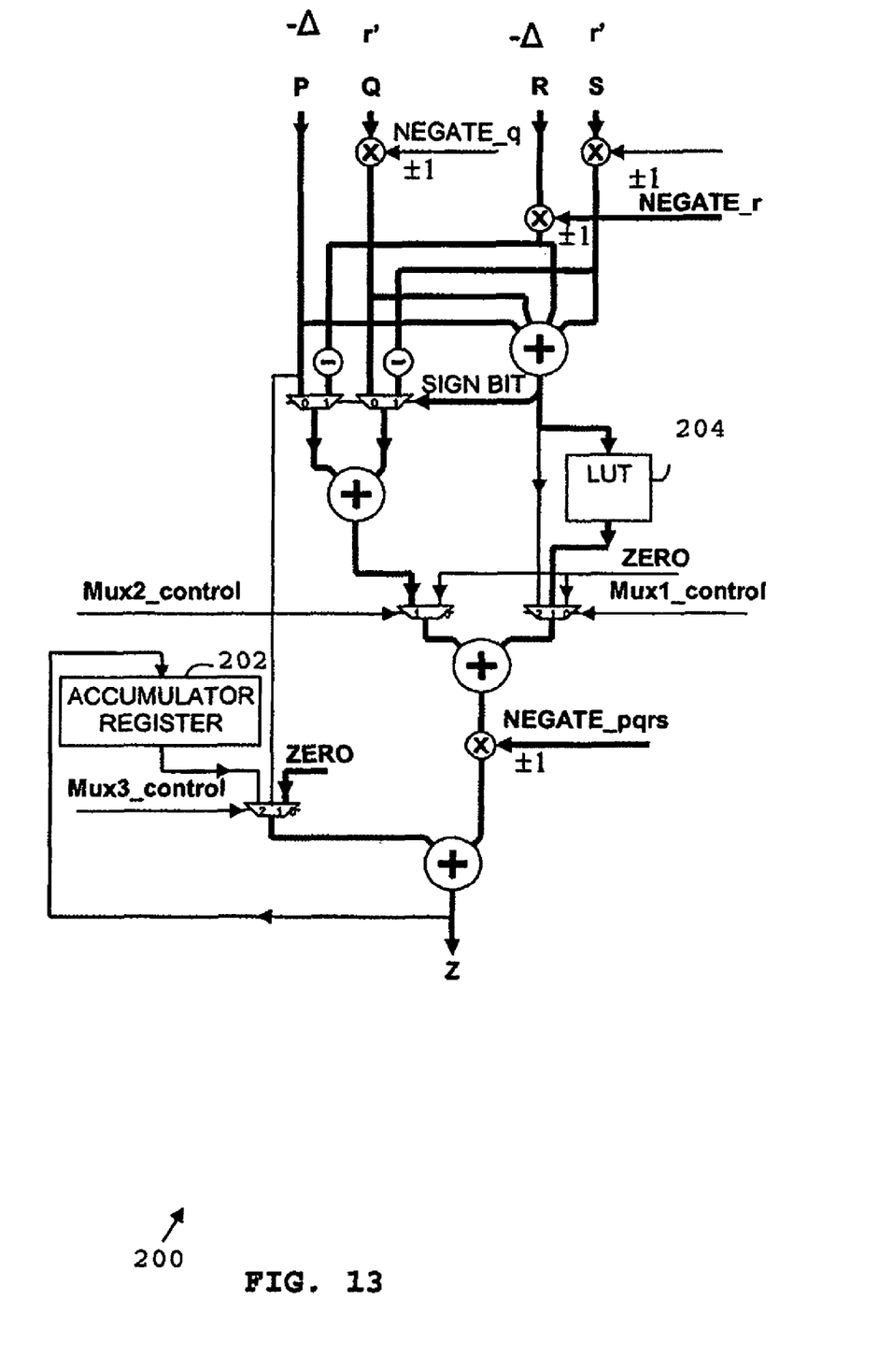
FIG. 13 shows a schematic of a reconfigurable execution unit, configured for determining the log-likelihood ratios for $i_2$ and $q_2$, in accordance with an embodiment of the invention.
Figure 15:
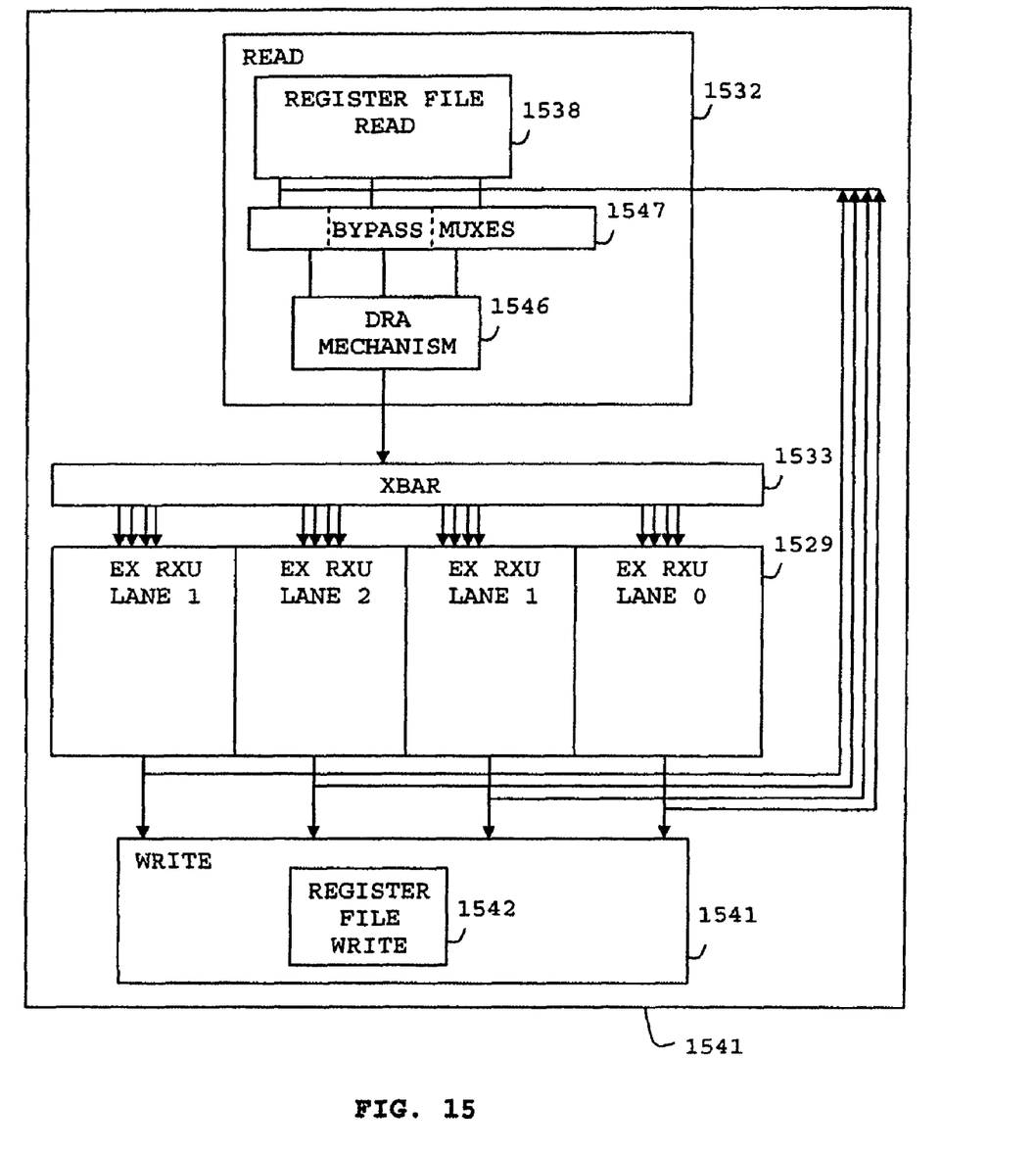
FIG. 15 shows a block diagram of a reconfigurable deep execution unit of the computer system of FIG. 14, in which log-likelihood ratios may be determined in accordance with an embodiment of the invention.
Figure 16:
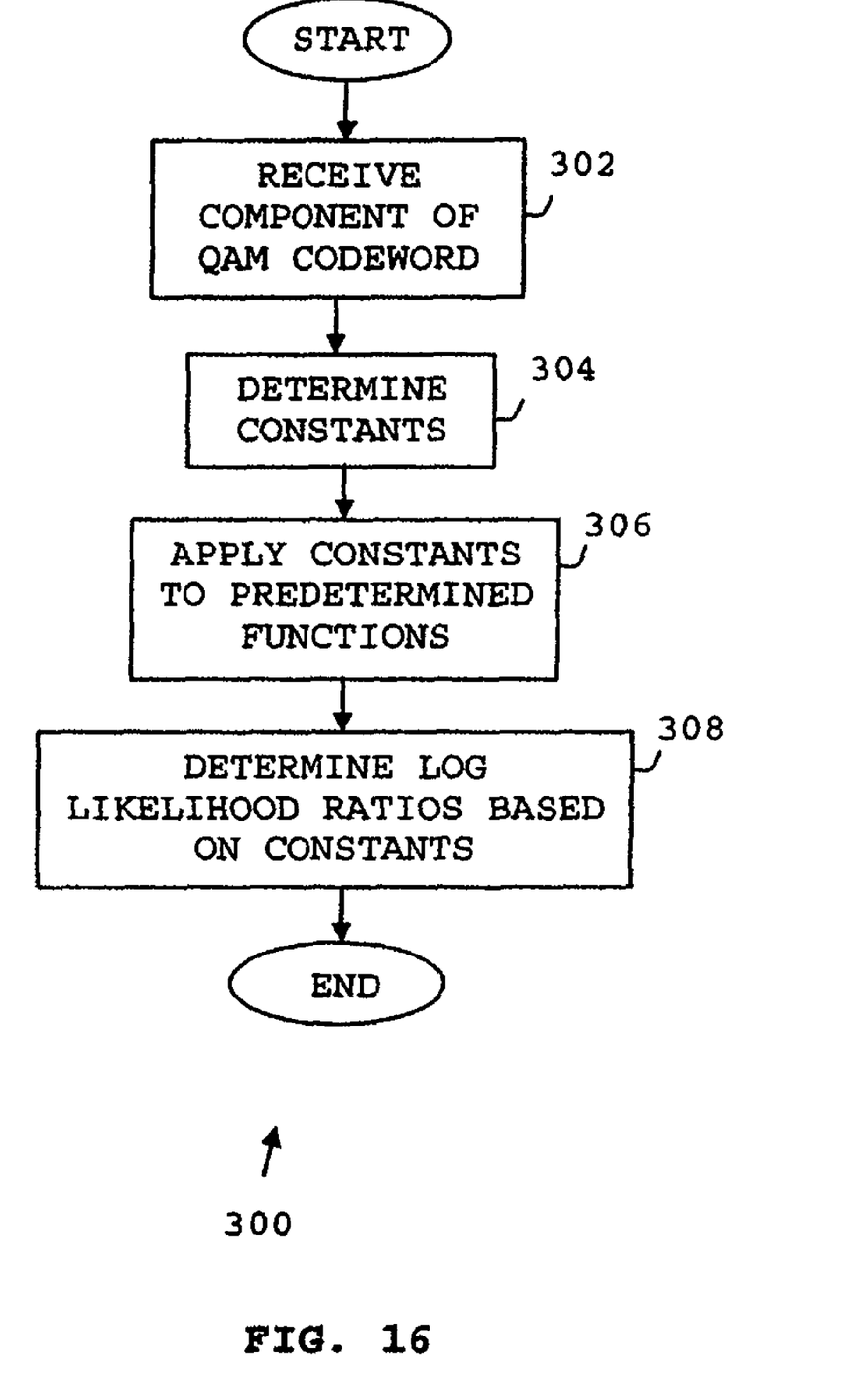
FIG. 16 shows a method in accordance with an embodiment of the invention.

By way of a non-limiting example and with reference to FIG. 16 shows a method 300 in accordance with an embodiment of the invention. The method of FIG. 16 is described in conjunction with reference to FIG. 10-13. In an embodiment of the invention, the only two constants computed 304 are the offset constant and the pre-scale constant. This embodiment may be implemented in a reconfigurable execution processor 200 or soft-decision module 32,100, as shown in the embodiments of FIG. 10-13. FIG. 10 shows a block diagram of a computer system 100 in which log-likelihood ratios may be determined. Constant/input selector 102 and LUT 204 may correspond to constant sub-modules 33,35 and LUT 41 of FIG. 2. In the log-likelihood ratio sub-module 37, MAX* unit 104 and accumulator register 202 with reference to LUT 204 determine the log-likelihood ratio for $i_1,q_1$, and MAX* unit 106 with reference to LUT 204 determines the log-likelihood ratio for $i_2,q_2$. FIG. 11 and FIG. 12 show in more detail the connections in bold that need to be created by custom-coded instructions for the reconfigurable processor, in order to calculate the log-likelihood ratios 308 for $i_1$ and $q_1$ 302, in a first step FIG. 11 and second step FIG. 12. Similarly, FIG. 13 shows the connections in bold that are created in the reconfigurable processor 200 in order to calculate $i_2$ and $q_2$. The values of the inputs of the processing units in FIG. 11-13 may be set and based on the offset constant and the pre-scale constant, and stored values in lookup table 204. The look up table 204 may store the correction value to implement MAX* function 306 to complete the state-metric computation to calculate the log-likelihood ratios, and may demodulate QAM signals with other values. In other words, the input value r' may be set to either $r'_I$ (for determining components $i_1$ and $i_2$), or to $r'_Q$ (for determining components $q_1$ and $q_2$) using the pre-scale constant k. Similarly, the input value off may be set to Δ using the offset constant Δ (for determining all four bits $i_1, i_2, q_1, q_2$), in order to compute the log-likelihood ratios using the configurations of FIG. 11-13. In FIG. 11 the result of r'+MAX* is stored in the accumulator register 202 when r' is off, in the first step in the calculation of $i_1$ and $q_1$. In FIG. 12 the value MAX* with -r' off is subtracted from the result stored in the accumulator register in the second step for the calculation of $i_1$ and $q_1$. FIG. 13 shows the single step required for the calculation of $i_1$ and $q_1$ when $-MAX^\$$ is calculated when -r' and r' is off. In this way, the log-likelihood ratios for either $i_1$ or $q_1$ may be calculated in two cycles in every SIMD lane, and the log-likelihood ratios for either $i_2$ or $q_2$ may be calculated in one cycle in every SIMD lane. A configuration of a SIMD lane is discussed in greater detail with reference to FIG. 14-15.

Figure 14:
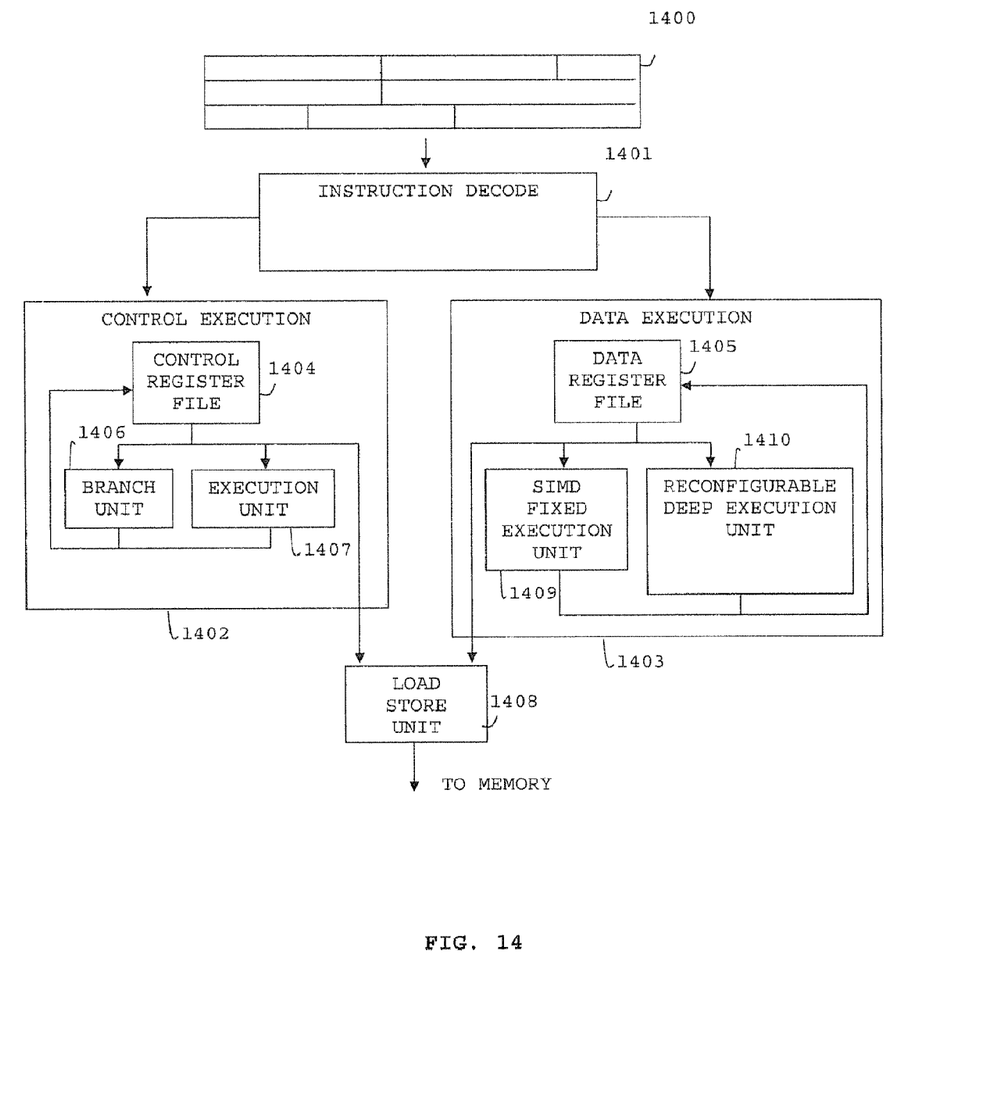
FIG. 14 shows an architectural block diagram of a computer system having separate control and data execution paths, in which log-likelihood ratios may be determined according to an embodiment of the invention.

In an embodiment, log-likelihood ratios may be determined in the context of a reconfigurable execution unit used in a computer system having separate control and data execution paths. This embodiment is shown for illustrative purposes, however, it will be appreciated that embodiments of the invention may be implemented on other computer system architectures. FIG. 14 shows an architectural block diagram of such a computer system, in which log-likelihood ratios may be determined according to an embodiment of the invention. An instruction decode unit 1401 separates individual instructions of a set of instruction packets 1400 into instructions for execution by a dedicated control execution path 1402, and instructions for execution by a dedicated data execution path 1403. Each dedicated execution path 1402 and 1403 has its own register file, in control register file 1404 and data register file 1405. Control execution path 1402 has its own functional units, such as branch unit 1406 and execution unit 1407. The data execution path 1403 has functional units such as a SIMD fixed execution unit 1409, and a reconfigurable deep execution unit 1410. The control execution path 1402 and the data execution path 1303 share a load store unit 1408.

FIG. 15 shows a block diagram of the reconfigurable deep execution unit 1510, in which log-likelihood ratios may be determined, according to an embodiment of the invention. This embodiment is provided for illustrative purposes, and it will be appreciated that embodiments of the invention may be implemented on other computer system architectures. In operation, the reconfigurable execution unit 1510 of the embodiment of FIG. 15 is pipelined as follows. All instructions for the execution unit 1510 have a five cycle latency, for example, four instruction issue slots to fill between an instruction executed by the execution unit 1510 and any other data-side instruction consuming its result. Four pipeline stages for the execution unit 1510 may include the READ stage 1532, the XBAR stage 1533, the EX0-3 stage 1526-1529, and the WRITE stage 1541. The READ stage 1532 may read the data register file 1538 and selects the 64-bit XBAR stage inputs 1539 and 1540. The two 64-bit operands src1 1530 and src0 1531 are fetched from the data register file 1538. The values of the 64-bit XBAR stage inputs 1539 and 1540 are then determined using selectors 1543 and 1544, each of which selects either a 64-bit operand 1530, 1531 or a scratchpad read vector (spval) 1545 to be a XBAR stage input 1539, 1540. The XBAR stage 1533 may steer the eight 16-bit operands in inputs 1539 and 1540 to the lane inputs P, Q, R, and S of the SIMD lanes 1526-1529, and may comprise sixteen, five-way, 16-bit wide multiplexers (one for each input of each lane). 48-bits are required to control the multiplexers, and the bits are a function of an opcode found in each instruction for the reconfigurable execution unit 1510, which may be looked up in configuration lookup tables. The EX0-3 stage may comprise the SIMD lanes 1526-1529, which may include reconfigurable adders, shifters, multipliers, etc. The WRITE stage 1541 may write to a data register 1542. The four 16-bit Z-lane outputs of the SIMD lanes 1526-1529 may then be bypassed back to the READ stage 1532 using bypass muxes 1547, completing the five-cycle latency for the execution unit 1510.

With regard to the description of the embodiment of FIG. 15 as a reconfigurable execution unit, it is noted that, herein, "configurable" signifies the ability to select an operator configuration from amongst a plurality of pseudo-static operator configurations, at least some of which are selectable by an operation code portion of a data processing instruction. Also in accordance with embodiments herein, a "configurable" instruction allows the performance of customized operations at the level of multibit values, for example, at the level of four or more multibit values, or at the level of words. In accordance with an implementation of an embodiment of the invention shown in FIG. 15, the operators of the execution lanes 1526-1529 are advantageously pre-configured into various operator classes. For example, operators may be pre-configured in the class of multiply operators, ALU operators, state operators, cross-lane permuters, and other pre-configured classes may be possible. However, even though the classes of operators are pre-configured, there is run-time flexibility for instructions to be able to arrange: (i) connectivity of the operators within each class; and (ii) connectivity with operators from the other classes, for the final arrangement of a specific configuration for implementing a given algorithm, such as the configurations shown in FIG. 11-13 for determining log-likelihood ratios.

It will be understood that the system and method for determining turbo decoder inputs in a QAM digital modulation system as described above provides advantages, such as providing accurate inputs for the turbo decoder to minimize the number of turbo decoder iterations without jeopardizing system performance and introducing further complexity to the system. Additionally, embodiments of the invention may be applied to other QAM systems (n-QAM), for example 32, 64, 256, etc. QAM systems, and the scope of the invention is not limited to the specific 16-QAM level of modulation embodiments. Similarly, the scope of the invention is not limited to the specific turbo coded embodiments. Other embodiments may be envisaged with other coding types. It will be appreciated that specific embodiments of the invention are discussed for illustrative purposes, and various modifications may be made without departing from the scope of the invention as defined by the appended claims.

What is claimed is:

1. A method for determining log-likelihood ratios for quadrature amplitude modulation (QAM) signals of a set of bits of a QAM codeword, the method comprising:

determining, by a computer system, an offset constant $\Delta$ given by $$\frac{8a^2 E_S}{N_o},$$

and a pre-scale constant k given by $$\frac{4a\sqrt{E_S}}{N_0},$$

where Es=coded symbol energy, $N_0$=noise power spectral density, and a=a normalization constant; and determining, by the computer system, a log-likelihood ratio for each bit of the set of the bits of the codeword using a set of functions based on said offset constant and said pre-scale constant.

2. A method according to claim 1 wherein the codeword is a turbo coded codeword.

3. A method according to claim 1, wherein the codeword corresponds to at least a portion of a signal transmitted in a wireless system.

4. A method according to claim 3, wherein the wireless system is a mobile third-generation cellular system.

5. A method according to claim 3, wherein the wireless system operates according to a Code-Division Multiple Access (CDMA) standard.

6. A method according to claim 3, wherein the wireless system operates according to a High-Speed Downlink Packet Access (HSDPA) portion of the Wireless Code-Division Multiple Access (WCDMA) standard.

7. A method according to claim 1, wherein the codeword is a 16-QAM codeword.

8. A method according to claim 7, wherein a set of individual bits of the codeword comprises four information bits mapped to the 16-QAM codeword.

9. A method according to claim 1, further comprising determining a log-likelihood ratio $\Lambda$ for an individual bit $i_1$, given that the at least one received component is $r_I$, and a scaled received component $r'_I$ is defined as $r_I$ multiplied by the pre-scale constant k, and for the offset constant $\Delta$, in accordance with the function:

$$\Lambda_{i_1}(r'_I) = r'_I + \max^*(r'_I, \Delta) - \max^*(-r'_I, \Delta)$$

where the function max* is defined as max*(x, y)=max (x, y)+ln(1+exp[−|x−y|]).

10. A method according to claim 1, further comprising determining a log-likelihood ratio ($\Lambda$) for an individual bit $i_2$, given that the at least one received component is $r_I$, and a scaled received component $r'_I$ is defined as $r_I$ multiplied by the pre-scale constant k, and for the offset constant $\Delta$, in accordance with the function:

$$\Lambda_{i_2}(r'_I) = -\max^\$(-r'_I - \Delta, r'_I - \Delta)$$

where the function max is defined by:

$$\max^\$(x, y) = \max(x, y) + \ln\left[1 + \exp[-|x-y|] - \exp\left[-\left|\frac{x-y}{2}\right|\right]\right].$$

11. A method according to claim 1, further comprising determining a log-likelihood ratio ($\Lambda$) for an individual bit $q_1$, given that the at least one received component is $r_Q$, and a scaled received component $r'_Q$ is defined as $r_Q$ multiplied by the pre-scale constant k, and for the offset constant $\Delta$, in accordance with the function:

$$\Lambda_{q_1}(r'_Q) = r'_Q + \max^*(r'_Q, \Delta) - \max^*(-r'_Q, \Delta)$$

where the function max* is defined as max* (x, y)=max(x, y)+ln(1+exp[−|x−y|]).

12. A method according to claim 1, further comprising determining a log-likelihood ratio ($\Lambda$) for an individual bit $q_2$, given that the at least one received component is $r_Q$, and a scaled received component $r'_Q$ is defined as $r_Q$ multiplied by the pre-scale constant k, and for the offset constant $\Delta$, in accordance with the function:

$$\Lambda_{q_2}(r'_Q) = -\max^\$(-r_Q - \Delta, r'_Q - \Delta)$$

where the function max$^\$$ is defined by:

$$\max{}^\$(x, y) = \max(x, y) + \ln\left[1 + \exp[-|x-y|] - \exp\left[-\left|\frac{x-y}{2}\right|\right]\right].$$

13. A method according to claim 1, further comprising using a custom-coded instruction to configure a reconfigurable execution unit to perform at least a portion of a determination of a log-likelihood ratio for at least one of the individual bits, the determination comprising using at least one of the two constant values.

14. A method according to claim 13, further comprising setting a value of an input of the reconfigurable execution unit based on the at least one constant value used in the log-likelihood ratio determination.

15. A method according to claim 13, further comprising using the reconfigurable execution unit to complete a calculation of the log-likelihood ratio for the at least one individual bit in two cycles.

16. A method according to claim 13, further comprising using the reconfigurable execution unit to complete a calculation of the log-likelihood ratio for the at least one individual bit in one cycle.

17. A method according to claim 13, wherein the reconfigurable execution unit comprises a single instruction multiple data lane of a computer system.

18. A method according to claim 17, wherein the computer system comprises a separate control execution path and a separate data execution path.

19. A method according to claim 18, wherein the reconfigurable execution unit forms a portion of the separate data execution path.

20. A computer system, the system comprising:
a dedicated control execution path comprising a branch unit and a control execution unit; and
a dedicated data execution path comprising a reconfigurable execution unit, the control execution path being separate from the data execution path;
wherein the reconfigurable execution unit comprises a single instruction multiple data (SIMD) lane of the computer system, and wherein the reconfigurable execution unit is configured by a custom-coded instruction to perform at least a portion of a determination of a log-likelihood ratio for an individual bit of a quadrature amplitude modulation (QAM) codeword, wherein the log-likelihood ratio is determined based on determining an offset constant $\Delta$ given by $$\frac{8a^2 E_S}{N_0},$$

and a pre-scale constant k given by $$\frac{4a\sqrt{E_S}}{N_0},$$

where $E_S$=coded symbol energy, $N_0$=noise power spectral density, and a=a normalization constant.

21. A computer system according to claim 20 wherein the QAM codeword is a turbo coded codeword.

22. A computer system according to claim 20, wherein the codeword corresponds to at least a portion of a signal transmitted in a wireless system.

23. A computer system according to claim 22, wherein the wireless system is a mobile third-generation cellular system.

24. A computer system according to claim 22, wherein the wireless system operates according to a Code-Division Multiple Access (CDMA) standard.

25. A computer system according to claim 22, wherein the wireless device operates according to a High-Speed Downlink Packet Access Portion (HSDPA) of the Wireless Code-Division Multiple Access (WCDMA) standard.

26. A computer system according to claim 20, wherein the codeword is a 16-QAM codeword.

27. A computer system according to claim 20, wherein a set of individual bits of the codeword comprises four information bits mapped to the 16-QAM codeword.

28. A computer system according to claim 20, wherein the determination of the determination of the log-likelihood ratio is made using a function, the output of the log-likelihood ratio is based on received signal characteristics corresponding to the codeword.

29. A computer system according to claim 28 wherein the received signal characteristics corresponding to the codeword comprise signal energy and noise power spectral density.

30. A computer system according to claim 28, wherein an input value of the reconfigurable execution unit is determined based on at least one constant value used in the log-likelihood ratio determination.

31. A computer system according to claim 28, wherein the reconfigurable execution unit is capable of calculating the log-likelihood ratio for the at least one individual bit in two cycles.

32. A computer system according to claim 28, wherein the reconfigurable execution unit is capable of calculating the log-likelihood ratio for the at least one individual bit in one cycle.

33. A method according to claim 1 wherein the set of functions is stored in a look-up table.

34. A computer system according to claim 28 wherein the function is stored in a look-up table.

* * * * *